(12) United States Patent
Nguyen et al.

(10) Patent No.: US 6,888,367 B1
(45) Date of Patent: May 3, 2005

(54) METHOD AND APPARATUS FOR TESTING INTEGRATED CIRCUIT CORE MODULES

(75) Inventors: Thai M. Nguyen, San Jose, CA (US); James T. Ngo, San Jose, CA (US); William Shen, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/767,314

(22) Filed: Jan. 28, 2004

(51) Int. Cl.[7] .............................................. G01R 31/26
(52) U.S. Cl. ..................................................... 324/765
(58) Field of Search ............................ 324/158.1, 765, 324/759, 763, 764, 761, 537, 533, 528

(56) References Cited

U.S. PATENT DOCUMENTS 5,963,109 A * 10/1999 Schiltmans .................. 333/26

6,260,175 B1 * 7/2001 Basel ............................ 716/1

* cited by examiner

Primary Examiner—David Zarneke
Assistant Examiner—Trung Q. Nguyen
(74) Attorney, Agent, or Firm—Fitch, Even, Tabin & Flannery

(57) ABSTRACT

A method of testing a core module includes steps of: (a) providing a core module of an integrated circuit design; (b) connecting an end user input and a core module test input to separate I/O pins of the core module to isolate logic associated with an end user signal from that associated with a core module test signal; and (c) multiplexing the end user signal and the core module test signal in the core module in response to a core module test mode signal.

20 Claims, 9 Drawing Sheets

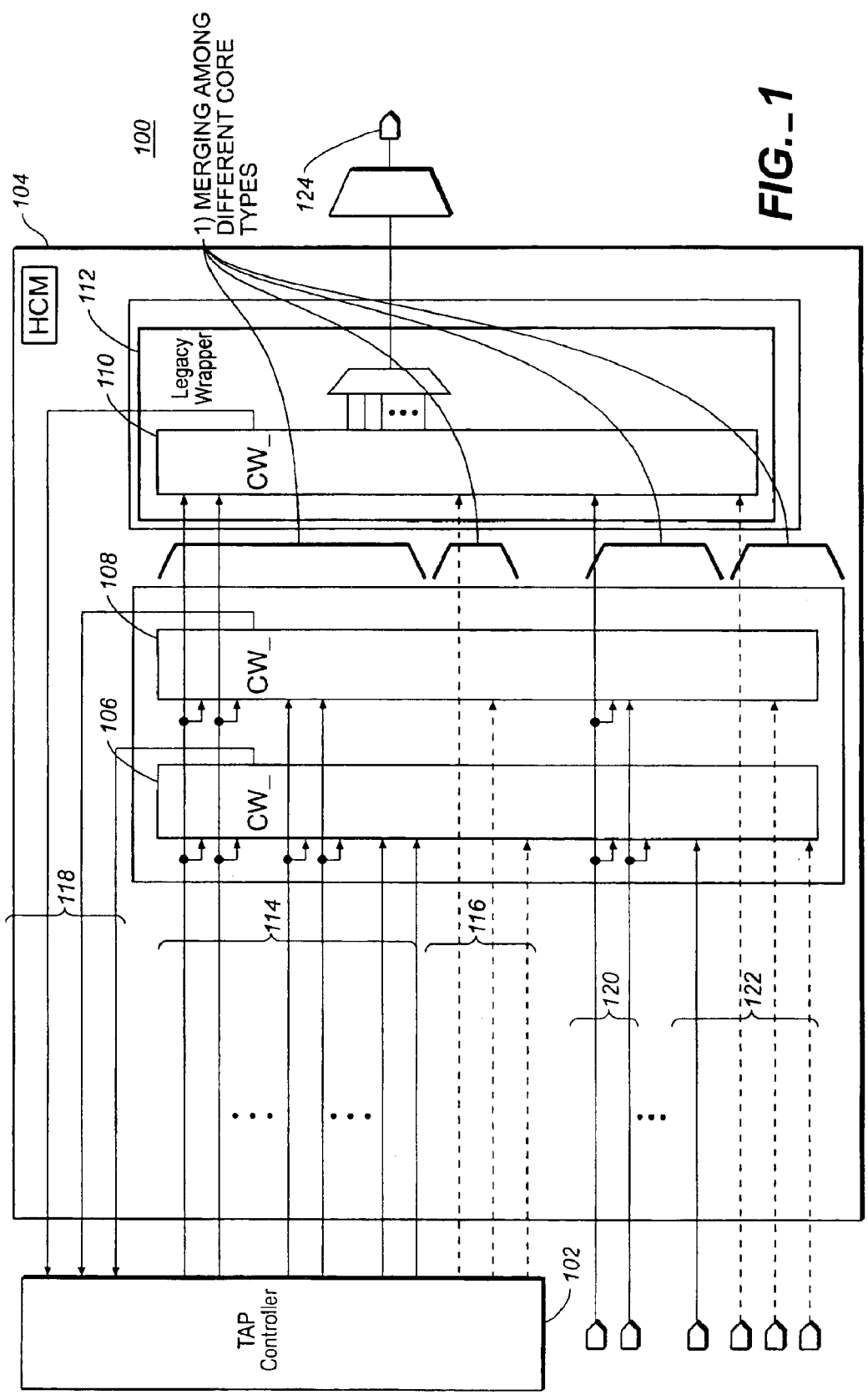
FIG._1

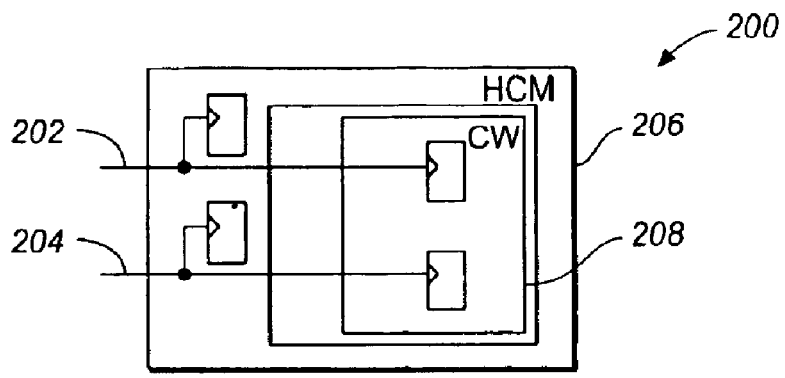
FIG._2
(PRIOR ART)
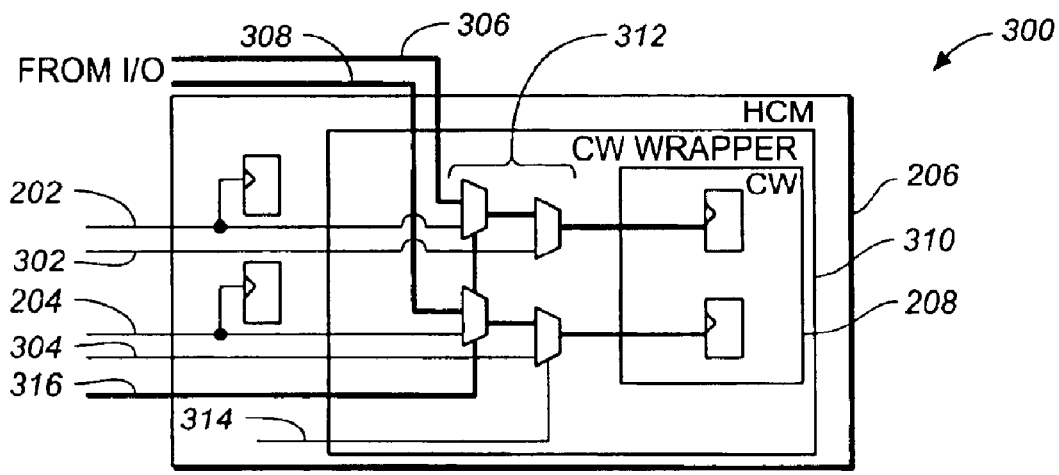
FIG._3
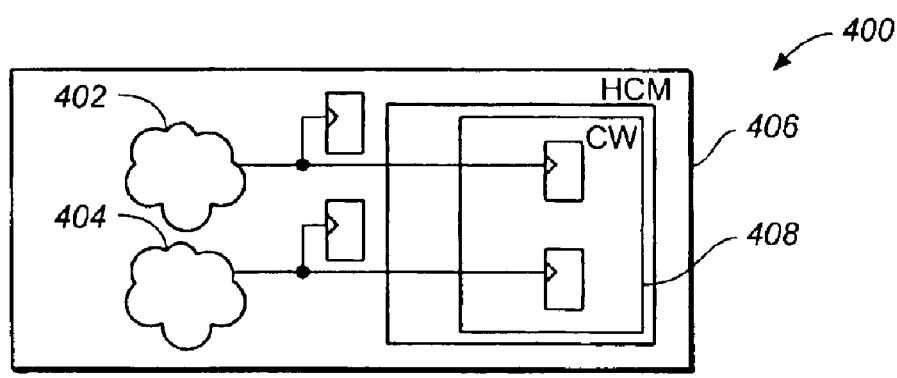
FIG._4
(PRIOR ART)

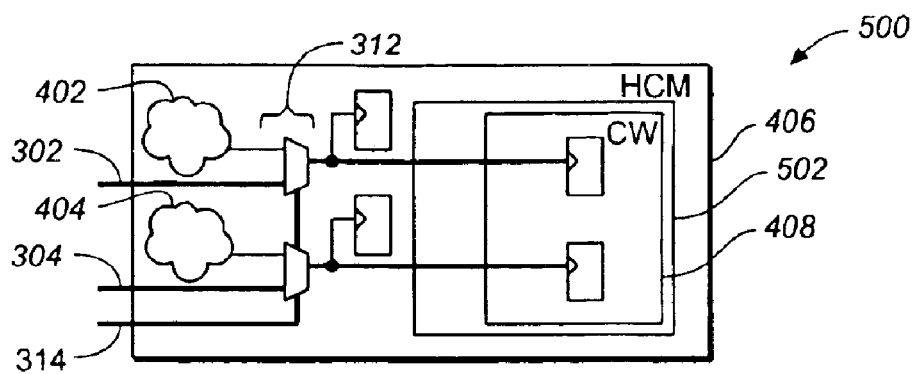
FIG._5
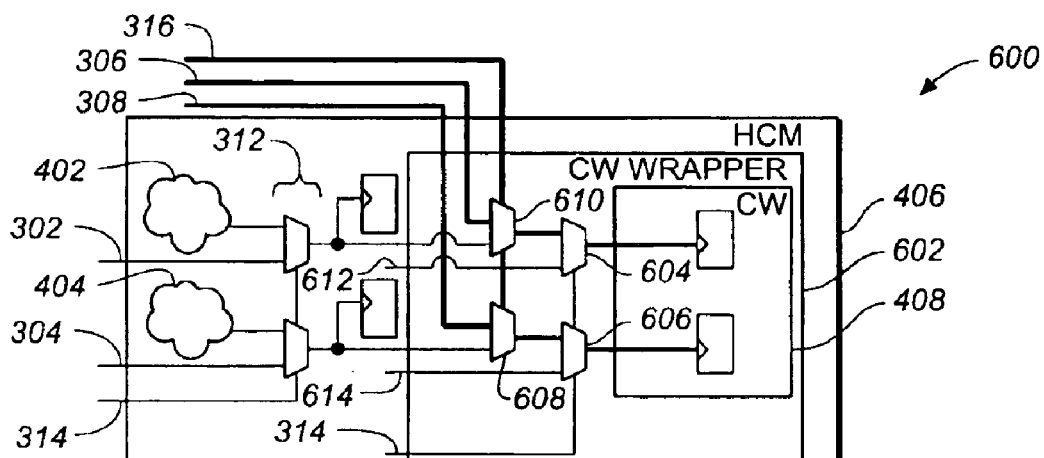
FIG._6
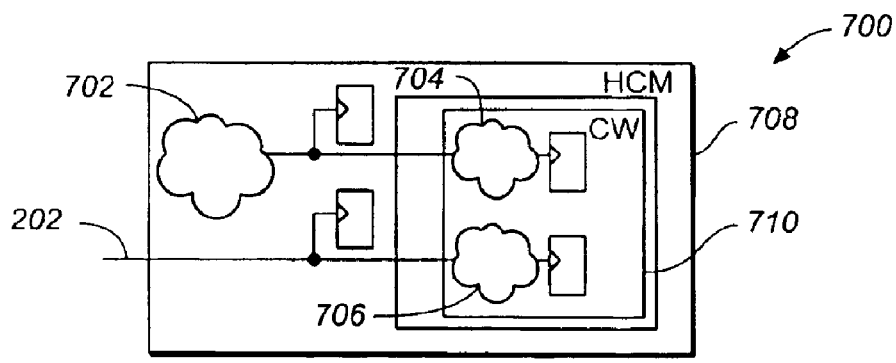
FIG._7
(PRIOR ART)

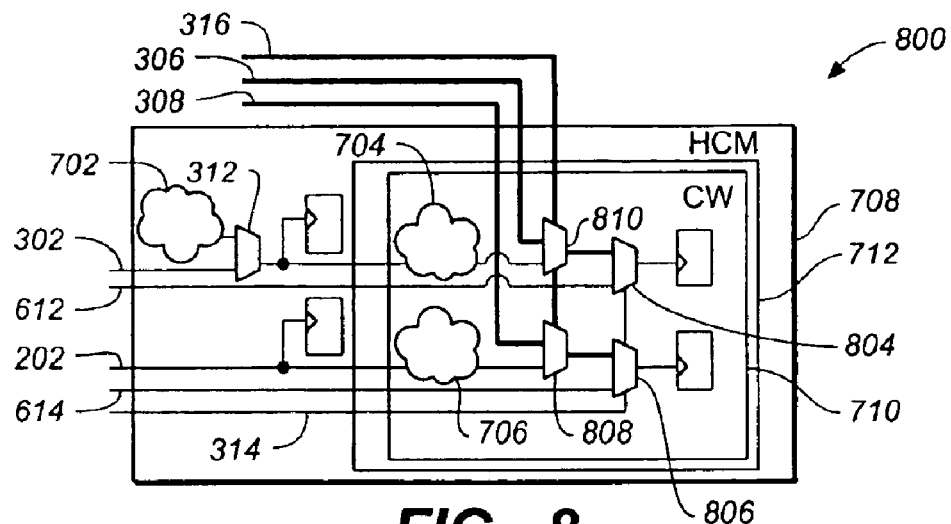
FIG._8
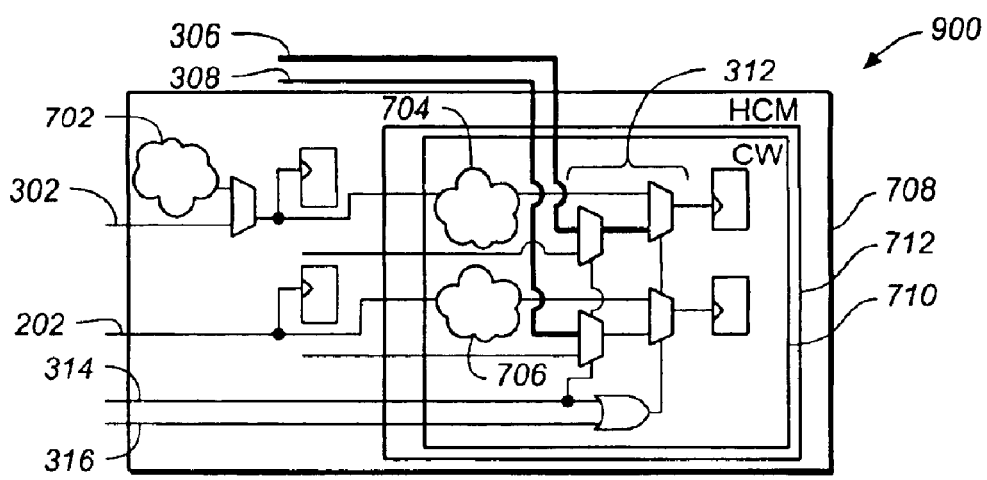
FIG._9
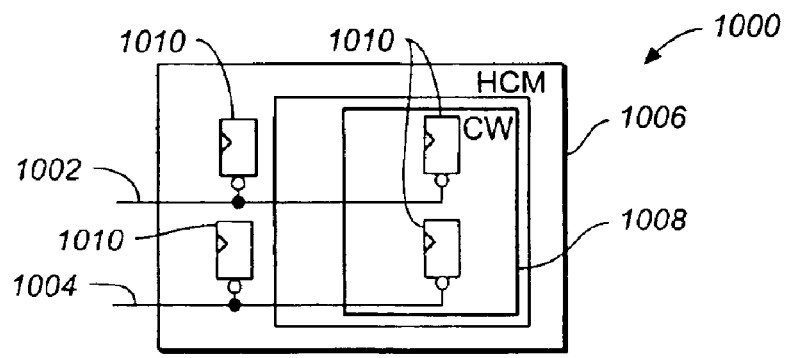
FIG._10
(PRIOR ART)

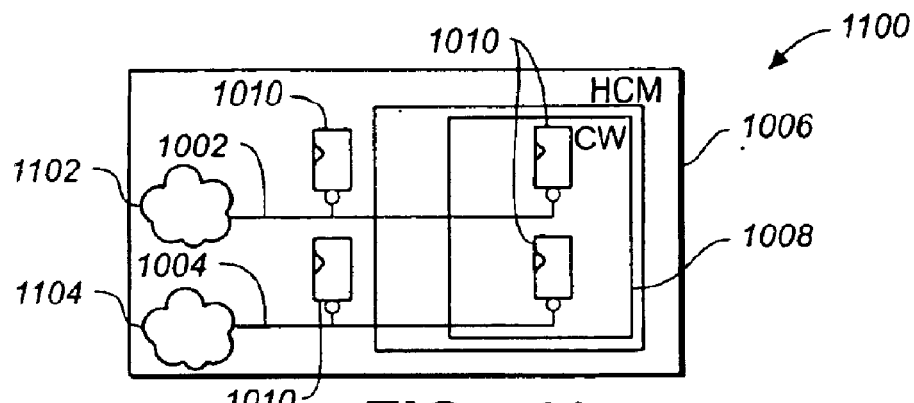
FIG._11
(PRIOR ART)
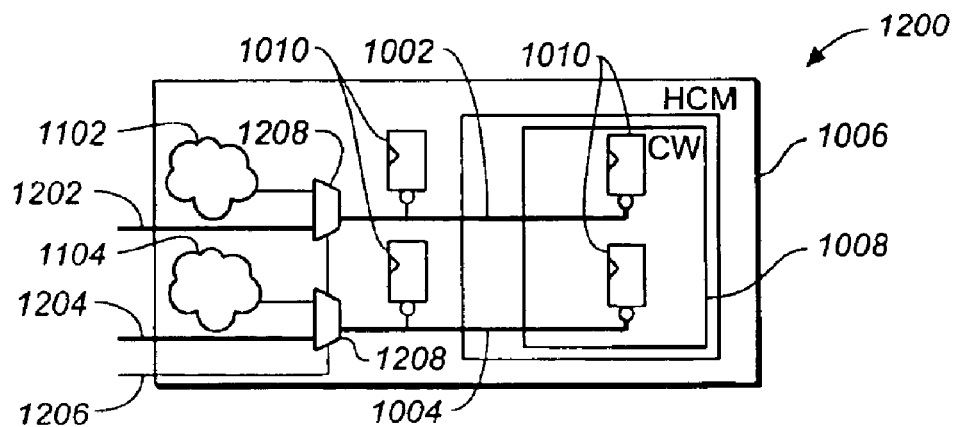
FIG._12
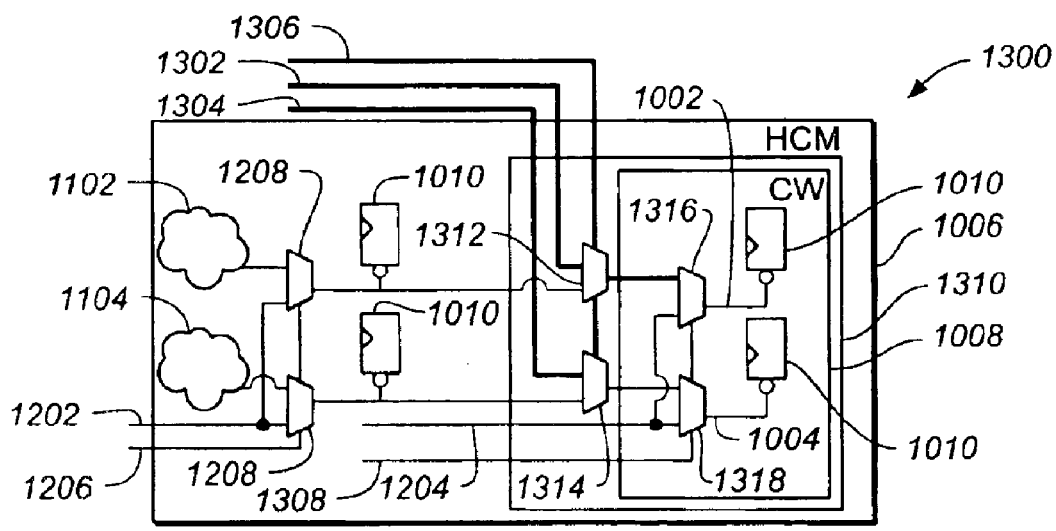
FIG._13

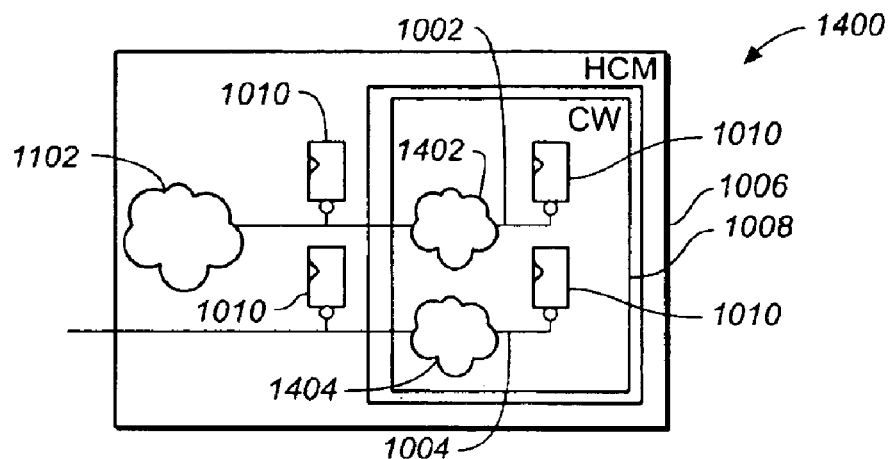
FIG._14
*(PRIOR ART)*
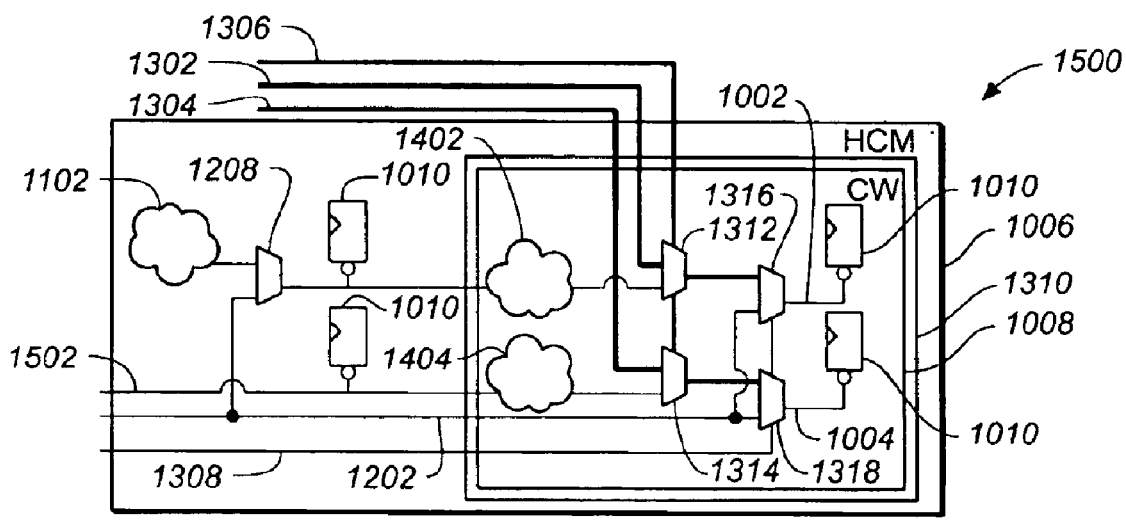
FIG._15

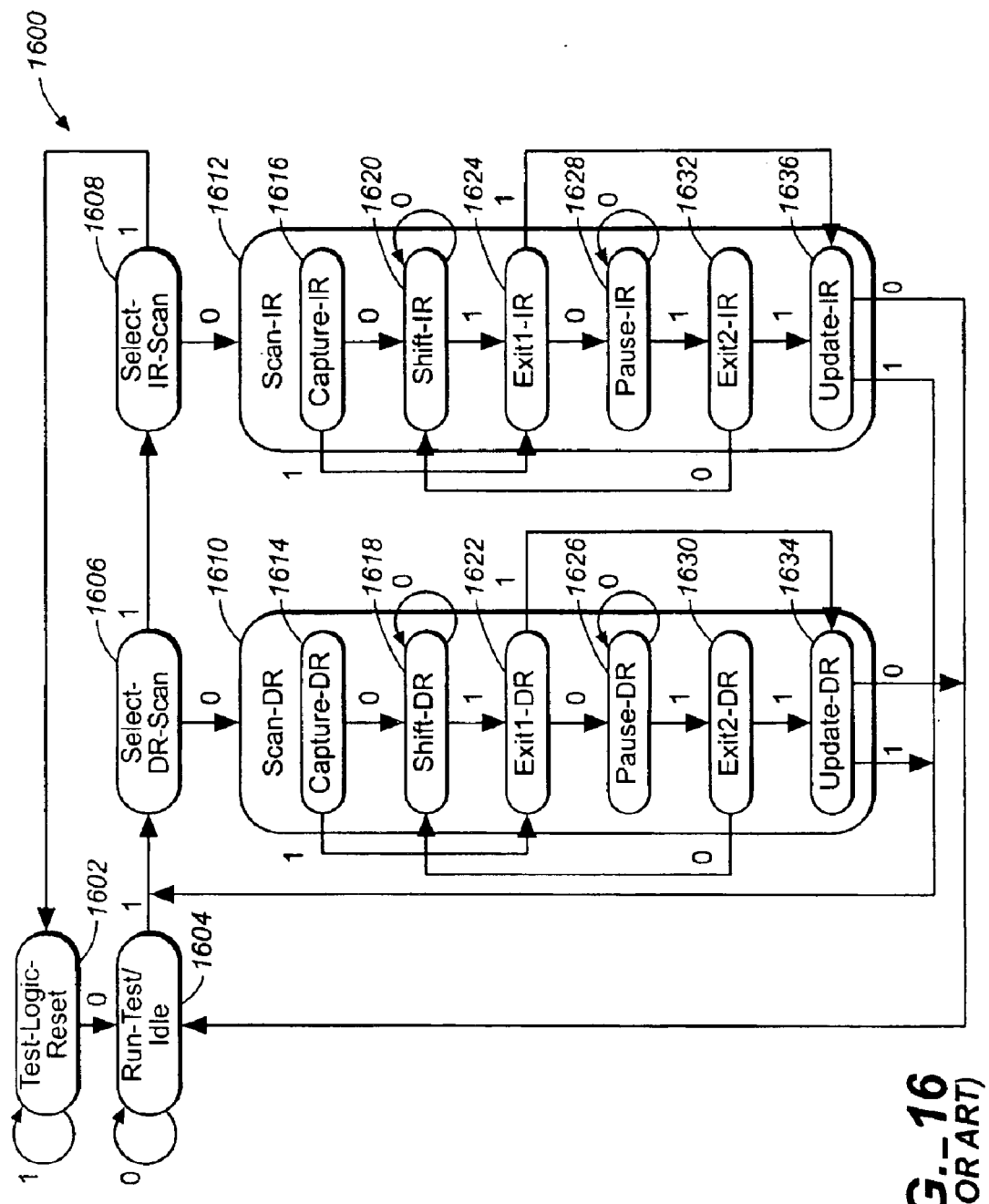
FIG._16
(PRIOR ART)

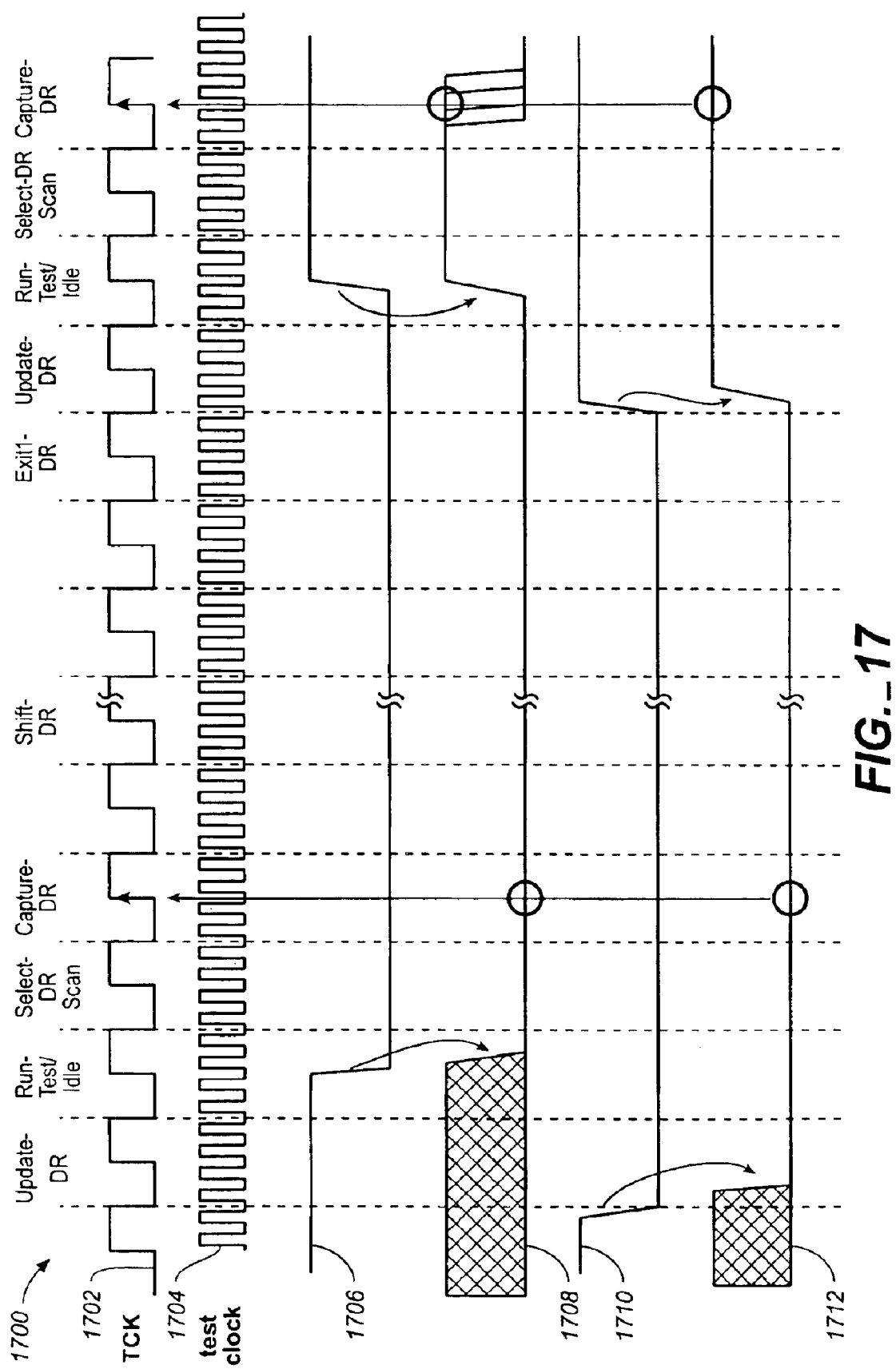
FIG._17

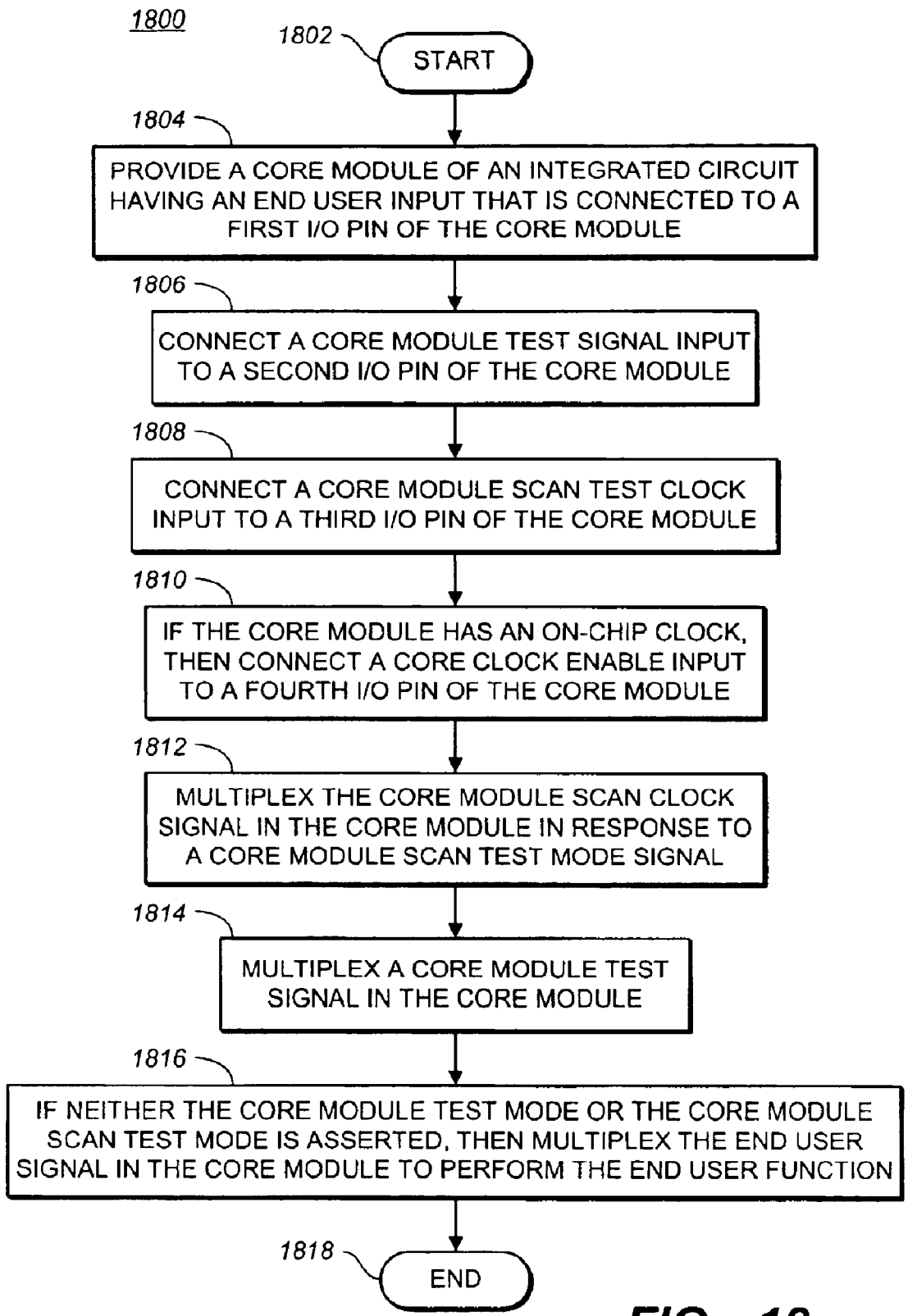
FIG._18

METHOD AND APPARATUS FOR TESTING INTEGRATED CIRCUIT CORE MODULES

BACKGROUND OF THE INVENTION

1. Field of the Invention

The present invention is directed to testing and screening of integrated circuit dies to detect defective devices. More specifically, but without limitation thereto, the present invention is directed to a method of screening defective dies by introducing a test signal to the integrated circuit die and comparing the output of the integrated circuit die with a predetermined test result to detect faults in the performance of the integrated circuit die.

2. Description of Related Art

Core modules that are embedded, for example, in application-specific integrated circuits (ASICs) for a customer, or end user, are usually accessed via functional logic in the ASIC. The core modules are typically tested using a core module test signal pattern generated by customer logic. Consequently, this type of testing may only be performed by the customer.

SUMMARY OF THE INVENTION

In one aspect of the present invention, a method of testing a core module includes steps of:
(a) providing a core module of an integrated circuit design;
(b) connecting an end user input and a core module test input to separate I/O pins of the core module to isolate logic associated with an end user signal from that associated with a core module test signal; and
(c) multiplexing the end user signal and the core module test signal in the core module in response to a core module test mode signal.

In another aspect of the present invention, an apparatus includes:
a core module of an integrated circuit;
an end user input and a core module test input connected to separate I/O pins of the core module to isolate logic associated with an end user signal from that associated with a core module test signal; and
a multiplexer for multiplexing the end user signal and the core module test signal in the core module in response to a core module test mode signal.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a routing diagram for testing core modules according to an embodiment of the present invention;

FIG. 2 illustrates a schematic for testing a core module driven by a clock on chip according to the prior art;

FIG. 3 illustrates a schematic for testing a core module according to an embodiment of the present invention;

FIG. 4 illustrates a schematic for testing a core module according to the prior art in which the core module clock is driven by functional logic on-chip;

FIG. 5 illustrates an alternate schematic for testing the core module of FIG. 4 according to the prior art;

FIG. 6 illustrates a schematic for testing the core module of FIG. 4 according to an embodiment of the present invention;

FIG. 7 illustrates a schematic for testing a core module according to the prior art in which the core module clock is driven by functional logic inside the core module and by an external clock;

FIG. 8 illustrates a schematic for testing the core module of FIG. 7 according to an embodiment of the present invention;

FIG. 9 illustrates a schematic for testing the core module of FIG. 7 according to an alternative embodiment of the present invention;

FIG. 10 illustrates a schematic for testing a core module with multiple reset inputs according to the prior art;

FIG. 11 illustrates a schematic for testing a core module with multiple reset inputs driven by functional logic according to the prior art;

FIG. 12 illustrates a schematic for testing the core module of FIG. 11 according to the prior art;

FIG. 13 illustrates a schematic for testing the core module of FIG. 11 according to an embodiment of the present invention;

FIG. 14 illustrates a schematic for testing a core module with multiple reset inputs driven by functional logic inside a core module according to the prior art;

FIG. 15 illustrates a schematic for testing the core module of FIG. 14 according to an embodiment of the present invention;

FIG. 16 illustrates a typical state diagram 1600 of the prior art for the test access port controller of FIG. 1;

FIG. 17 illustrates core module test signal timing for the test access port (TAP) states in FIG. 16; and FIG. 18 illustrates a flow chart of a method of testing integrated circuit core modules according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

A disadvantage of previous methods of core testing is that functional testing through logic in the built-in self-test (BIST) circuitry is dependent on the functional logic in the ASIC, which may differ from one application to another. As a result, testing requires a time-consuming cooperative effort from the end user and the application engineer.

The method and apparatus for testing a core module of the present invention overcome the disadvantage of dependence on functional logic by providing access to each signal required by the built-in self-test through the chip I/O pins and the test access port (TAP) controller pins.

In one aspect of the present invention, an apparatus includes:
a core module of an integrated circuit;
an end user input and a core module test input connected to separate I/O pins of the core module to isolate logic associated with an end user signal from that associated with a core module test signal; and
a multiplexer for multiplexing the end user signal and the core module test signal in the core module in response to a core module test mode signal.

FIG. 1 illustrates a routing diagram 100 for testing core modules according to an embodiment of the present invention. Shown in FIG. 1 are a test access port (TAP) controller 102, a hierarchical containment module 104, a first core module 106, a second core module 108, a third core module 110, a legacy wrapper 112, static core module test input signals 114 and 116, static core module test output signals 118, I/O core module test input signals 120 and 122, and I/O core module test output signals 124. To facilitate the description of the figures, references to signals also refer to the corresponding input and output pins.

In the routing diagram 100 of FIG. 1, three categories for routing test signals are illustrated. The first category includes core module test signals that are allowed to be merged with pins from multiple cores. In the example of FIG. 1, the static core module test input signals 114 and the I/O core module test input signals 120 are allowed to be merged with pins from the first core module 106, the second core module 108, and the third core module 110.

Static core module test signals switch only at the beginning or at the end of a test. For example, set, reset, and power control are generally asserted at the beginning of a test, while, status signals such as pass/fail are generally asserted at the end of a test. If a core module has multiple set or reset pins, then each set or reset pin may have to be driven separately, that is, by a dedicated test signal. Set or reset pins from identical core modules may be merged, that is, driven by a common test signal. The static core module test signals 114 and 116 are connected to the TAP controller 102. Static core module test output signals are routed to the TAP controller 102 directly from the core wrapper or the core module. Because the static core module test output signals are not cycled during testing, the precise switching time of these signals is generally not critical. The state of a core module test output pin should be predictable at the time it is checked by the TAP controller 102. This means that the core module test output pin remains in the passing state until a failure occurs, at which time it switches to another state and remains in that state indefinitely. The state of the core module test output pin is usually controlled by a core module test input signal from an I/O pin. The hierarchical containment module 104 encapsulates all hardmacros in the ASIC design.

I/O core module test signals 120 and 122 include synchronous and asynchronous test signals that are connected to the first core module 106, the second core module 108, and the third core module 110 by the chip I/O pins.

The second category includes test signals that are allowed to be merged with pins only from multiple cores of the same type. For example, if the first core module 106 and the second core module 108 are identical and the third core module 110 is a different module type, then a test signal that is merged with pins from the first core module 106 and the second core module 108 but not with a pin from the third core module 110 would be included in the second category.

The third category includes test signals that are not allowed to be merged. In the example of FIG. 1, the static core module test input signals 116 and the I/O core module test input signals 122 are each routed to only one of the first core module 106, the second core module 108, and the third core module 110 respectively. The static core module test input signals 116 include power control signals that are used to switch each of the first core module 106, the second core module 108, and the third core module 110 between a powered and an unpowered state for shutting off each core module or group of core modules to perform parallel testing or to conserve power. The power control signals that allow power to be switched in each core module individually is an important feature of the present invention. The power control signals also allow clock pins to be merged from different core modules whether or not the core modules are the same type, because individual core modules may be switched off even when the clocks signals are active. Core modules that do not have power control signals should not have clock pins merged with those from other core modules, so that each core module may be shut down independently by its respective clock pin.

The number of I/O core module test input and output signals and the number of static core module test signals is preferably reduced in the core wrapper or in the core module. For example, if each submodule in the core module has a separate power-down pin, the signals driving each of the power-down pins may be merged into a single static core module test signal.

Because the I/O core module test output signals are only used for testing, it may be possible to merge them in the core wrapper or in the core module, subject to the condition that only one set of core module test output signals may be observed at a time. The I/O core module test pins may be merged at a top level of the integrated circuit design to distribute the test signals to the core modules The multiplexer select inputs for the I/O core module test output signals should be driven by a static core module test signal. Static core module test output signals should not be merged in the core wrapper or in the core module. As used herein, the term "multiplexer" may be any device used to select a specific signal or signal group from a group of signals or signal groups. The following examples are illustrated with two-input multiplexers having an output that follows a signal applied to one of the two inputs in response to a signal applied to a select input, however, other types of multiplexing devices may be used according to well-known techniques to practice various embodiments of the present invention within the scope of the appended claims.

FIG. 2 illustrates a schematic for testing a core module driven by a clock on chip according to the prior art; Shown in FIG. 2 are a first clock input 202, a second clock input 204, a hierarchical containment module 206, and a core module 208.

In FIG. 2, the first clock input 202 and the second clock input 204 are driven, for example, by a phase-locked loop or a dedicated clock pin. The first clock input 202 and the second clock input 204 carry both the scan test signals and core module test signals, which is not allowed in the method of the present invention.

FIG. 3 illustrates a schematic 300 for testing a core module according to an embodiment of the present invention. Shown in FIG. 3 are a first clock signal 202, a second clock signal 204, a hierarchical containment module 206, a core module 208, a first core module scan test clock signal 302, a second core module scan test clock signal 304, a first I/O core module test signal 306, a second I/O core module test signal 308, a core wrapper 310, multiplexers 312, a core module scan mode signal 314, and a core module test mode signal 316.

In the test clock arrangement of FIG. 3, the first clock signal 202 and the second clock signal 204 are separately multiplexed from the scan clock signals represented by the first core module scan test clock signal 302 and the second core module scan test clock signal 304 and from the I/O core module test signals represented by the first I/O core module test signal 306 and the second I/O core module test signal 308. The provision of separate, or dedicated, I/O core module test signals to drive the clock inputs of the core module 208 rather than combining or merging the I/O core module test signals with the scan test signals inside the core module is an important feature of the present invention. The core wrapper 310 includes the multiplexers 312 that switch the clock inputs of the core module 208 to the scan clock signals in the scan test mode in response to the core module scan test mode signal 314 and to the core module test inputs in response to the core module test mode signal 316.

FIG. 4 illustrates a schematic 400 for testing a core module according to the prior art in which the core module clock is driven by functional logic on-chip. Shown in FIG. 4 are a first logic cloud 402, a second logic cloud 404, a hierarchical containment module 406, and a core module 408.

In FIG. 4, the first logic cloud 402 and the second logic cloud 404 inside the hierarchical containment module 406 drive the clocked inputs of the core module 408.

FIG. 5 illustrates an alternate schematic 500 for testing the core module of FIG. 4 according to the prior art. Shown in FIG. 5 are a first core module scan test clock signal 302, a second core module scan test clock signal 304, multiplexers 312, a core module scan test mode signal 314, a first logic cloud 402, a second logic cloud 404, a hierarchical containment module 406, a core module 408, and a core wrapper 502.

In the arrangement of FIG. 5, the clock inputs of the core module 408 are separately driven from the first logic cloud 402 and the second logic cloud 404 and from the scan test inputs represented by the first scan clock input 302 and the second scan clock input 304. However, the I/O core module test inputs may not properly be merged with the scan test inputs to practice the present invention.

FIG. 6 illustrates a schematic 600 for testing the core module of FIG. 4 according to an embodiment of the present invention. Shown in FIG. 6 are a first scan test clock signal 302, a second scan test clock signal 304, a first I/O core module test signal 306, a second I/O core module test signal 308, multiplexers 312, a core module scan test mode signal 314, a core module test mode signal 316, a first logic cloud 402, a second logic cloud 404, a hierarchical containment module 406, a core module 408, a core wrapper 602, and core wrapper multiplexers 604, 606, 608 and 610, a first core module scan test clock signal 612, and a second core module scan test clock signal 614.

In the arrangement of FIG. 6, the I/O core module test signals 306 and 308 are separately multiplexed from the first logic cloud 402 and the second logic cloud 404 in response to the core module test mode signal 316 by the core wrapper multiplexers 608 and 610 and are also separately multiplexed from the core module scan clock signals represented by the first core module scan test clock signal 612 and the second core module scan test clock signal 614 in response to the core module scan test mode signal 314 by the core wrapper multiplexers 604 and 606. As a result, the I/O core module test signals 306 and 308, the first core module scan test clock signal 612 and the second core module scan test clock signal 614 are separately multiplexed to the core module 408 in response to the core module scan test mode signal 314 and the core module test mode signal 316 so that the operation of the core module 408 is controlled by only the core module test signals in the core module test mode and by only the core module scan test signals in the core module scan test mode.

The core wrapper 602 includes the multiplexers 312 that switch the clock inputs of the core module 408 to the scan test signals in response to the core module scan test mode signal 314 and to the core module test signals in response to the core module test mode signal 316.

FIG. 7 illustrates a schematic for testing a core module according to the prior art in which the core module clock is driven by functional logic inside the core module and by an external clock. Shown in FIG. 7 are an external clock signal 202, a first logic cloud 702, a second logic cloud 704, a third logic cloud 706, a hierarchical containment module 708, and a core module 710.

In FIG. 7, the second logic cloud 704 and the third logic cloud 706 inside the core module 710 are driven by the external clock signal 202 and by the first logic cloud 702 respectively.

FIG. 8 illustrates a schematic for testing the core module of FIG. 7 according to an embodiment of the present invention. Shown in FIG. 8 are a first clock signal 202, a core module scan test clock signal 302, a first I/O core module test signal 306, a second I/O core module test signal 308, a multiplexer 312, a core module scan test mode signal 314, a core module test mode signal 316, a first core module scan test clock signal 612, a second core module scan test clock signal 614, a first logic cloud 702, a second logic cloud 704, a third logic cloud 706, a hierarchical containment module 708, a core module 710, a core wrapper 712, and core multiplexers 804, 806, 808 and 810.

In the arrangement of FIG. 8, the core multiplexers 804, 806, 808 and 810 are added to isolate the second logic cloud 704 and the third logic cloud 706. The first logic cloud 702 is isolated automatically when the core wrapper is incorporated into the integrated circuit design. As a result, the end user clock signals represented by the clock signal 202, the first logic cloud 702, the second logic cloud 704, and the third logic cloud 706 are separately multiplexed from the core module scan test clock signals 612 and 614 by the core multiplexers 804 and 806 in response to the core module scan test mode signal 314 and from the core module test signals represented by the first I/O core module test signal 306 and the second I/O core module test signal 308 by the core multiplexers 808 and 810 in response to the core module test mode signal 316. The core module 710 includes the core multiplexers 804, 806, 808 and 810 after the second logic cloud 704 and the third logic cloud 706 that switch the clock inputs of the core module 710 to the scan test signal 302 in response to the scan test mode signal 314 and to the I/O core module test signals in response to the core test mode signal 316. If no test mode signal is asserted, the core multiplexers 804, 806, 808 and 810 switch the clock inputs of the core module 710 to the end user clock signals.

FIG. 9 illustrates a schematic for testing the core module of FIG. 7 according to an alternative embodiment of the present invention. FIG. 9 is identical to FIG. 8, except that in FIG. 9 the multiplexers 312 are rearranged so that only a single multiplexer 312 lies in each functional clock path inside the core module 710.

FIG. 10 illustrates a schematic 1000 for testing a core module with multiple reset inputs according to the prior art. Shown in FIG. 10 are a first reset input 1002, a second reset input 1004, a hierarchical containment module 1006, a core module 1008, and flip-flops 1010.

In FIG. 10, the same set or reset signals may be used in both the functional mode and in the scan test mode to drive the flip-flops 1010, however, the core test mode may require that the set or reset signals be driven separately from the functional mode and the scan test mode.

FIG. 11 illustrates a schematic 1100 for testing a core module with multiple reset inputs driven by functional logic according to the prior art. Shown in FIG. 11 are a first reset input 1002, a second reset input 1004, a hierarchical containment module 1006, a core module 1008, flip-flops 1010, a first logic cloud 1102, and a second logic cloud 1104.

FIG. 11 is identical to FIG. 10, except that the reset signals are generated inside the hierarchical containment module 1006 from the first logic cloud 1102 and the second logic cloud 1104 in the hierarchical containment module 1006 rather than from the chip I/O pins.

FIG. 12 illustrates a schematic 1200 for testing the core module of FIG. 11 according to the prior art. Shown in FIG. 12 are a first reset input 1002, a second reset input 1004, a hierarchical containment module 1006, a core module 1008, flip-flops 1010, a first logic cloud 1102, a second logic cloud 1104, a first scan test reset signal 1202, a second scan test reset signal 1204, a core module scan test mode signal 1206, and scan multiplexers 1208.

In FIG. 12, the scan multiplexers 1208 switch the first reset input 1002 and the second reset input 1004 between the functional reset signals represented by the first logic cloud 1102 and the second logic cloud 1104 and the scan test reset signals represented by the first scan test reset signal 1202 and the second scan test reset signal 1204 in response to the core module scan test mode signal 1206. A disadvantage of the method illustrated in FIG. 12 is that the scan test signals are merged with the I/O core module test signals during core testing. Merging the scan test signals with the I/O core module test signals during core testing would result in switching flip-flops outside the core module, unnecessarily increasing power consumption. An important feature of the present invention is that merging the scan test signals with the I/O core module test signals during core testing is not allowed in the method of the present invention.

FIG. 13 illustrates a schematic 1300 for testing the core module of FIG. 11 according to an embodiment of the present invention. Shown in FIG. 13 are a first reset input 1002, a second reset input 1004, a hierarchical containment module 1006, a core module 1008, flip-flops 1010, a first logic cloud 1102, a second logic cloud 1104, a first scan test reset signal 1202, a second scan test reset signal 1204, a first core module scan test mode signal 1206, scan multiplexers 1208, a first core test reset signal 1302, a second core test reset signal 1304, a core test mode signal 1306, a core module scan test mode signal 1308, a core wrapper 1310, and core multiplexers 1312, 1314, 1316 and 1318.

In FIG. 13, the core multiplexers 1312, 1314, 1316 and 1318 in the core wrapper 1310 and the core module 1008 switch the first reset input 1002 and the second reset input 1004 between the core module scan test reset signals 1302 and 1304 in response to the core test mode signal 1306 and to the scan test reset signals 1202 and 1204 in response to the core module scan test mode signal 1308. This feature provides a separate, or dedicated, scan test reset specific to the core module 1008 as well as a separate core test reset specific to the core module 1008. The same arrangement used for reset signals may also be used for set signals to practice various embodiments of the present invention within the scope of the appended claims.

FIG. 14 illustrates a schematic 1400 for testing the core module with multiple reset inputs driven by functional logic inside a core module according to the prior art. Shown in FIG. 14 are a first reset input 1002, a second reset input 1004, a hierarchical containment module 1006, a core module 1008, flip-flops 1010, a first logic cloud 1102, a second logic cloud 1402, and a third logic cloud 1404.

FIG. 14 is identical to FIG. 11, except that the reset signals are generated by functional logic inside the core module 1008 from the second logic cloud 1402 and the third logic cloud 1404 in the core module 1108 and in the hierarchical containment module 1006.

FIG. 15 illustrates a schematic 1500 for testing the core module of FIG. 14 according to an embodiment of the present invention. Shown in FIG. 15 are a first reset input 1002, a second reset input 1004, a hierarchical containment module 1006, a core module 1008, flip-flops 1010, a first logic cloud 1102, a scan test reset signal 1202, a scan multiplexer 1208, a first core test reset signal 1302, a second core test reset signal 1304, a core module test mode signal 1306, a core module scan test mode signal 1308, a core wrapper 1310, core multiplexers 1312, 1314, 1316 and 1318, logic clouds 1102, 1402 and 1404, and an end user reset input 1502.

In FIG. 15, the core multiplexers 1312 and 1314 in the core module 1008 switch the first reset input 1002 and the second reset input 1004 between the reset signals from the logic clouds 1402 and 1404 and the core test reset signals 1302 and 1304 in response to the core module test mode signal 1306. The core multiplexers 1316 and 1318 switch the first reset input 1002 and the second reset input 1004 between the end user reset signals from the logic clouds 1402 and 1404 in response to the core module scan test mode signal 1308. This feature provides a separate, or dedicated, scan test reset specific to the core module 1008 as well as a separate core test reset specific to the core module 1008 that may be switched by separate multiplexer control signals.

FIG. 16 illustrates a typical state diagram 1600 of the prior art for the test access port controller of FIG. 1. Shown in FIG. 16 are a test logic reset state 1602, a run-test/idle state 1604, a select data register scan state 1606, a select input register scan state 1608, a scan data register state 1610, a scan input register state 1612, a capture data register state 1614, a capture input register state 1616, a shift data register state 1618, a shift input register state 1620, a first exit data register state 1622, a first exit input register state 1624, a pause data register state 1626, a pause input register state 1628, a second exit data register state 1630, a second exit input register state 1632, an update data register state 1634, and an update input register state 1636.

The static core module test input pins are driven by the TAP controller 102 in the update data register state 1634. The static core module test outputs are captured in the capture data register state 1614. The static core module test outputs are compared in the shift data register state 1618, one bit per clock cycle. The number of TAP clock cycles required for the shift data register state 1618 is equal to the bit width of the register. For example, if the register has a width of 100 bits, and if the TAP clock has a frequency equal to one-fourth of the core test clock frequency, then the time between the static core module test signal updates is (4×(1+1+1+100+1)=416 core test clock cycles.

Because static core module test input signals are only asserted in the update data register state 1634, several TAP clock cycles are required to step through the run-test/idle state, the select data register scan state, the capture data register state, the shift data register state, and first exit data register state before the static core module test input signals may be asserted again, and should therefore remain static throughout the test unless the update data register is repeated to override the previous states.

I/O core module test input signals are asserted as one vector for each run-test/idle state at the core test clock frequency, and consecutive I/O core module test input signals require repeated run-test/idle states to accommodate different possible ratios of the TAP clock frequency to the core test clock frequency. Because the number of test pins may be large, sharing primary input pins may be required, and I/O core module test input signals should only be assigned if absolutely necessary, and should be shared by merging with other core modules when possible.

A static core module test output signal may be captured and compared in each capture data register state and shift data register state of the TAP controller 102, which is identical to the time required for a static core module test input signal in the example described above and is the shortest time between sampling each static core module test output signal.

FIG. 17 illustrates core module test signal timing for the test access port (TAP) states in FIG. 16. Shown in FIG. 17 are a TAP clock signal 1702, a core module test clock signal 1704, a first I/O core module test input signal 1706, a first static core module test output signal 1708, a first static core module test input signal 1710, and a second static core module test output signal 1712.

In FIG. 17, the first static core module test output signal 1708 transitions to zero and one in response to the first I/O core module test input signal 1706. The first I/O core module test input signal 1706 is restricted to switch only once per run-test/idle state. Also, the second static core module test output signal 1712 transitions to zero and one in response to the first static core module test input signal 1710. In this example, both states of the static core module test output signals 1708 and 1712 may be captured by the TAP controller, because the outputs switch in response to the inputs. The test pattern preferably counts off the number of cycles needed, for example, by a loop vector that may be executed in the run-test/idle state. The static core module test output signals 1708 and 1712 should remain in the state to be observed after the completion of the test.

In another aspect of the present invention, a method of testing a core module includes steps of:

(a) providing a core module of an integrated circuit design;

(b) connecting an end user input and a core module test input to separate I/O pins of the core module to isolate logic associated with an end user signal from that associated with a core module test signal; and (c) multiplexing the end user signal and the core module test signal in the core module in response to a core module test mode signal.

FIG. 18 illustrates a flow chart 1800 of a method of testing integrated circuit core modules according to an embodiment of the present invention.

Step 1802 is the entry point of the flow chart 100.

In step 1804, a core module is provided having an end user input that is connected to a first I/O pin of the core module. The core module may be, for example, an embedded module in an application-specific integrated circuit design (ASIC).

In step 1806, a core module test signal input is connected to a second I/O pin of the core module according to well-known techniques.

In step 1808, a core module scan test clock input is connected to a third I/O pin of the core module. An important feature of the present invention is that the end user input, the core module test signal input, and the core module scan clock input are each connected to a separate I/O pin to isolate the logic associated with each of the input signals respectively. To simplify referencing signals and their corresponding inputs, the terms "input" and "signal" are used interchangeably. For example, the end user signal refers to the signal applied to the end user input.

In step 1810, if the core module has an on-chip clock, then a core clock enable input is connected to a fourth I/O pin of the core module for reducing power to the core module when the core module is not being used or tested.

In step 1812, the core module scan clock signal is multiplexed in the core module in response to a core module scan test mode signal as described above for performing a scan test.

In step 1814, a core module test signal is multiplexed in the core module for performing a core test in response to a core module test mode signal as described above. The core module test signal may be a clocked signal used for clocking flip-flops in the core module, or the core module test signal may be a static signal, for example, to switch power to the core module, to enable an on-chip clock, and to set or reset flip-flops in the core module. Switching power to the core module via a dedicated core module test signal and separately multiplexing the core module test signal in response to the core module test mode signal and the core module scan clock signal in response to the core module scan test mode signal so that the core module test mode signal and the core module scan test mode signal are not necessarily dependent on each other are important features of present invention.

In step 1816, if neither the core module test mode or the core module scan test mode is asserted, then the end user signal is multiplexed in the core module to perform the end user function. The separate multiplexing of the end user signal and each of the test signals isolates the logic associated with each signal so that logic used with one signal does not impact the function of the other signals.

Step 1818 is the exit point of the flow chart 1800.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method of testing a core module comprising steps of:

(a) providing a core module of an integrated circuit design;

(b) connecting an end user input and a core module test input to separate I/O pins of the core module to isolate logic associated with an end user signal from that associated with a core module test signal; and (c) multiplexing the end user signal and the core module test signal in the core module in response to a core module test mode signal.

2. The method of claim 1 wherein the core module test signal is a synchronous or asynchronous signal.

3. The method of claim 1 wherein the core module test signal is a static signal.

4. The method of claim 3 wherein the core module test signal is a set or reset signal.

5. The method of claim 3 further comprising a step of switching power to the core module between an on state and an off state in response to the core module test signal.

6. The method of claim 1 wherein the core module test signal is a synchronous or asynchronous signal.

7. The method of claim 1 wherein step (b) further comprises connecting a core module scan test clock input to a separate I/O pin of the core module to isolate logic associated with the end user signal and logic associated with the core module test signal from logic associated with a core module scan test clock signal.

8. The method of claim 7 wherein step (b) further comprises multiplexing the core module scan test clock signal in the core module in response to a core module scan test mode signal.

9. The method of claim 8 wherein the core module test mode signal and the core module scan test mode signal are independent of each other.

10. The method of claim 1 wherein step (b) comprises merging the I/O pin of the core module that is connected to the core module test input with an I/O pin at a top level of the integrated circuit design.

11. An apparatus comprising:

a core module of an integrated circuit;

an end user input and a core module test input connected to separate I/O pins of the core module to isolate logic associated with an end user signal from that associated with a core module test signal; and a multiplexer for multiplexing the end user signal and the core module test signal in the core module in response to a core module test mode signal.

12. The apparatus of claim 11 wherein the core module test signal is a synchronous or asynchronous signal.

13. The apparatus of claim 11 wherein the core module test signal is a static signal.

14. The apparatus of claim 13 further comprising a controller coupled to the core module for generating the static signal.

15. The apparatus of claim 13 wherein the controller is a test access port controller.

16. The apparatus of claim 11 wherein the core module test signal is a set signal, a reset signal, or a power on/off signal.

17. The apparatus of claim 11 further comprising a core module scan test clock input connected to a separate I/O pin of the core module to isolate logic associated with the end user signal and logic associated with the core module test signal from logic associated with a core module scan test clock signal.

18. The apparatus of claim 17 further comprising a multiplexer for multiplexing the core module scan test clock signal in the core module in response to a core module scan test mode signal.

19. The apparatus of claim 18 wherein the core module test mode signal and the core module scan test mode signal are independent of each other.

20. The apparatus of claim 11 wherein the I/O pin of the core module that is connected to the core module test input is merged with an I/O pin at a top level of the integrated circuit design.

* * * * *